US009829387B2

(12) United States Patent
Furtner

(10) Patent No.: US 9,829,387 B2
(45) Date of Patent: Nov. 28, 2017

(54) SYSTEM AND METHOD FOR TEMPERATURE SENSING

(71) Applicant: Infineon Technologies Austria AG, Villach (AT)

(72) Inventor: Wolfgang Furtner, Fuerstenfeldbruck (DE)

(73) Assignee: Infineon Technologies Austria AG, Villach (AT)

( * ) Notice: Subject to any disclaimer, the term of this patent is extended or adjusted under 35 U.S.C. 154(b) by 445 days.

(21) Appl. No.: 14/526,158

(22) Filed: Oct. 28, 2014

(65) Prior Publication Data

US 2016/0116345 A1    Apr. 28, 2016

(51) Int. Cl.
*G01K 7/01*    (2006.01)
(52) U.S. Cl.
CPC ..................................... *G01K 7/01* (2013.01)
(58) Field of Classification Search
None
See application file for complete search history.

(56) References Cited

U.S. PATENT DOCUMENTS

| 4,967,243 | A | 10/1990 | Baliga et al. |
| 5,059,820 | A | 10/1991 | Westwick |
| 5,815,027 | A | 9/1998 | Tihanyi et al. |
| 6,946,897 | B2 * | 9/2005 | Pearce ..................... G01K 7/01 |
| | | | 327/513 |
| 7,835,129 | B2 * | 11/2010 | Thiele ................ H03K 17/0822 |
| | | | 361/103 |
| 8,072,028 | B2 | 12/2011 | Krumrey et al. |
| 8,097,918 | B2 | 1/2012 | Kadow et al. |
| 8,373,449 | B2 | 2/2013 | Thiele et al. |
| 8,633,723 | B2 * | 1/2014 | Takeuchi ............ H01L 29/7397 |
| | | | 324/750.3 |
| 8,785,931 | B2 * | 7/2014 | Kinouchi ................. G01K 7/01 |
| | | | 257/368 |
| 2002/0140447 | A1 * | 10/2002 | Throngnumchai ...... G01K 7/42 |
| | | | 374/178 |
| 2013/0093411 | A1 | 4/2013 | Koeppl et al. |

(Continued)

FOREIGN PATENT DOCUMENTS

JP    2011142700 A    *    7/2011

OTHER PUBLICATIONS

Stitt et al., Burr-Brown Application Bulletin, "Diode-Based Temperatue Measurement," Sep. 1991, 6 pages.

*Primary Examiner* — Minh Phan
*Assistant Examiner* — Leon W Rhodes, Jr.
(74) *Attorney, Agent, or Firm* — Slater Matsil, LLP

(57) ABSTRACT

According to an embodiment, a method of operating a measurement circuit includes biasing a sense transistor to conduct current through a first conduction channel in a first direction during a first mode, injecting a measurement current into a body diode of the sense transistor during a second mode, measuring a first voltage across the sense transistor when the measurement current is injected, and determining a temperature of the sense transistor based on the first voltage. When the measurement current is injected, it is injected in a second direction opposite the first direction. The sense transistor is integrated in a semiconductor body with a load transistor having a second conduction channel, and the first conduction channel and the second conduction channel are coupled to an input node.

28 Claims, 11 Drawing Sheets

(56) References Cited

U.S. PATENT DOCUMENTS

2014/0015046 A1 1/2014 Thiele et al.
2014/0362490 A1* 12/2014 Maekawa .......... H03K 17/0828
361/103

* cited by examiner

SYSTEM AND METHOD FOR TEMPERATURE SENSING

TECHNICAL FIELD

The present invention relates generally to electronic circuit, and, in particular embodiments, to a system and method for temperature sensing.

BACKGROUND

Electronic switches, such as MOSFETs, IGBTs, or other types of transistors are widely used as electronic switches for switching electrical loads, such as motors, lamps, magnetic valves, and the like. In these applications, the electronic switch is connected in series with the load, where the series circuit with the electronic switch and the load is connected between power supply terminals. The load can be switched on and off by switching the electronic switch on and off.

Usually, the on-resistance of the electronic switch, which is the resistance of the electronic switch in the on-state, is lower than the resistance of the load, so that in a normal operation state a voltage drop across the electronic switch is significantly lower than a voltage drop across the load, when the electronic switch is switched on. When, however, there is a short circuit in the load and when the electronic switch is in the on-state, the voltage drop across the electronic switch increases and the electric power dissipated in the electronic switch increases. The increase in dissipated power results in an increased temperature of the electronic switch.

Also, during normal operation without a short circuit in the load, high current applications increase the electric power dissipated in the electronic switch, causing the temperature of the electronic switch to increase. Rising ambient temperature may also increase the junction temperature of the electronic switch. Regardless of whether the temperature increase indicates a short circuit problem, is due to normal high-current operation, or is caused by higher ambient temperature, too much temperature increase may lead to device failure or destruction in some cases or to nonoptimal performance in other cases. In order to prevent reduced performance or failure, the temperature in the electronic switch may be detected and the electronic switch may be switched off when the temperature reaches a given temperature threshold.

In order to detect the temperature in the electronic switch, a temperature measurement device may be included with the electronic switch inside the same package or attached to the package containing the electronic switch. The temperature measurement device includes a temperature sensor that indirectly measures the temperature of the electronic switch.

SUMMARY

According to an embodiment, a method of operating a measurement circuit includes biasing a sense transistor to conduct current through a first conduction channel in a first direction during a first mode, injecting a measurement current into a body diode of the sense transistor during a second mode, measuring a first voltage across the sense transistor when the measurement current is injected, and determining a temperature of the sense transistor based on the first voltage. When the measurement current is injected, it is injected in a second direction opposite the first direction. The sense transistor is integrated in a semiconductor body with a load transistor having a second conduction channel, and the first conduction channel and the second conduction channel are coupled to an input node.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
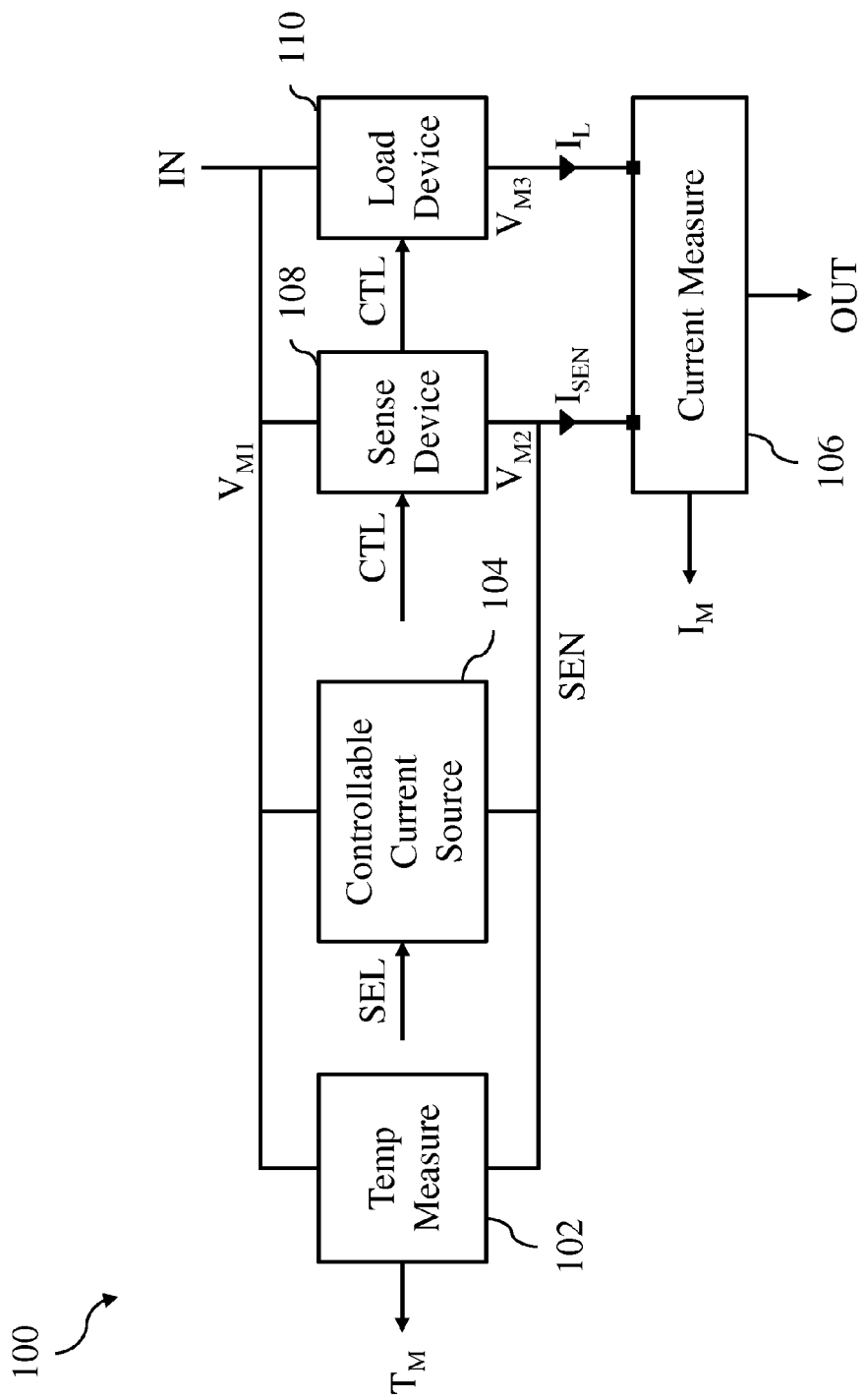
FIG. 1 illustrates a system block diagram of an embodiment measurement system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely electronic switches, and more particularly, temperature measurement circuits for electronic switches. Some of the various embodiments described herein include switching circuits including transistors, temperature measurements circuits coupled to switching circuits, and combined temperature and current measurement circuits coupled to switching circuits. In other embodiments, aspects may also be applied to other applications involving any type of temperature measurement circuit according to any fashion as known in the art.

Often in electronic circuits, a load transistor is coupled between an input terminal and an output load terminal and controlled to supply a current to a load coupled to the output load terminal. Such a load transistor may be included in numerous circuits, such as switching or non-switching power supplies and linear regulators, for example. According to an embodiment, a measurement circuit is coupled to a sense transistor that is integrated in the same semiconductor substrate as the load transistor. Both the sense transistor and the load transistor may receive the same control signals and have input conduction terminals coupled to the input terminal. In such embodiments, the sense transistor conducts a mirrored sense current that is proportional to the load current flowing in the load transistor without increasing the series resistance of the load path.

According to such an embodiment, the measurement circuit includes a controllable current source and a voltage measurement circuit. The controllable current source injects a current through the body diode of the sense transistor during a temperature measurement mode and the voltage measurement circuit measures the voltage across the sense transistor. Based on the voltage measured, the temperature of the sense transistor, which is proximally integrated in the same semiconductor substrate as the load transistor, may be calculated based on the relationship between voltage drop across a semiconductor junction (such as the body diode) and temperature. In one embodiment, the controllable current source may inject multiple currents through the body diode and the voltage measurement circuit may measure multiple voltages, such as between 2 and 32, for example. Based on the multiple voltages, the temperature may be accurately calculated by using the difference in the voltages.

In a further embodiment, the measurement circuit includes a current measurement circuit coupled to the sense transistor and the load transistor and measures the sense current during a current measurement mode in order to determine the load current. In such an embodiment, the measurement circuit measures and determines both temperature and current for a load transistor using a single sense transistor integrated in the semiconductor substrate with the load transistor. In a specific embodiment, the temperature measurement mode and the current measurement mode are separate. In one alternative embodiment, the temperature measurement approach described herein may be applied to the load transistor.

According to some embodiments, the measured temperature may be used to optimize the drive and control strategy for the application. In various embodiments, different drive currents, voltages, or signal slopes may be applied for different measured temperatures. In further embodiments, various control loop behaviour may be implemented for different measured temperatures.

FIG. 1 illustrates a system block diagram of an embodiment measurement system 100 including temperature measurement circuit 102, controllable current source 104, and current measurement circuit 106, all of which are coupled to sense device 108 and load device 110. According to various embodiments, load device 110 conducts a current between input terminal IN and output load terminal OUT based on control signal CTL and sense device 108 also conducts a current based on control signal CTL. In some embodiments, load device 110 and sense device 108 may be controlled with separate control signals in order to independently control various sensing modes and conduction modes.

In various embodiments, sense device 108 conducts sense current ISEN proportional to load current IL of load device 110. The proportional relationship between sense current ISEN and load current IL may be determined by the ratio of the semiconductor device sizes for sense device 108 and load device 110. Based on the proportional relationship of sense current ISEN and load current IL, current measurement circuit 106 measures second voltage VM2 from sense device 108 and third measurement voltage VM3 from load device 110 in order to determine load current IL. In some embodiments, current measurement circuit 106 generates measured current IM that is proportional to load current IL. In a specific embodiment, measured current IM is generated without introducing any additional series resistance in the load path between load device 110 and output load terminal OUT.

In various embodiments, measured current IM may be provided to a controller or calculation circuit in order to determine load current IL based on measured current IM. In other embodiments, current measurement circuit 106 may output a voltage signal proportional to load current IL or may include a digital calculation circuit and output a digital representation of load current IL.

According to various embodiments, controllable current source 104 supplies current into sense node SEN of sense device 108 based on select signal SEL in order to inject a current through a diode, such as a body diode, of sense device 108. In such embodiments, sense device 108 is biased or controlled to conduct sense current ISEN in a first direction from input terminal IN to sense node SEN during a first mode. During a second mode, sense device 108 is biased into a non-conducting state and controllable current source 104 injects a reverse current in a second direction, opposite the first direction, from sense node SEN through a diode within sense device 108 to input terminal IN.

In some embodiments, when controllable current source 104 injects the reverse current through sense device 108, temperature measurement circuit 102 measures first measurement voltage VM1 and second measurement voltage VM2 across sense device 108. Based in the measured voltage across sense device 108, temperature measurement circuit 102 generates temperature measurement signal TM that is related to the temperature of sense device 108. In some embodiments, temperature measurement signal TM is a voltage signal proportional to the temperature of sense device 108. In other embodiments, temperature measurement circuit 102 includes a digital calculation circuit and temperature measurement signal TM is a digital representation of the temperature of sense device 108. In various embodiments, because sense device 108 is integrated proximally in the same semiconductor substrate as load device 110, the measured temperature of sense device 108 may be very closely correlated to the temperature of load device 110 or may be substantially equal to the temperature of load device 110. In the various embodiments, the temperature of sense device 108 is determined using the relationship between the voltage across a semiconductor junction (as obtained by first measurement voltage VM1 and second measurement voltage VM2) and the temperature of the semiconductor junction, as is described further herein below in reference to the other figures.

In some embodiments, controllable current source 104 may supply a single reverse current through sense device 108. In other embodiments, controllable current source 104 may supply multiple reverse currents through sense device 108. In the various embodiments, select signal SEL may be supplied by a control circuit or by temperature measurement circuit 102. In the various embodiments, temperature measurement circuit 102 measures a single voltage or multiple voltages, one for each reverse current supplied through sense device 108. Based on the single voltage or the multiple voltages, temperature measurement circuit 102 may calculate the temperature in sense device 108.

According to some embodiments, current measurement circuit 106 and controllable current source 104 are not operated simultaneously. In such embodiments, current measurement circuit 106 may perform a current measurement and generate measured current IM when sense current ISEN is conducted through sense device 108. Similarly, temperature measurement circuit 102 with controllable current source 104 may perform a temperature measurement when sense current ISEN is not conducted through sense device 108, i.e., when control signal CTL turns sense device 108 into an off, or non-conducting, state. Thus, according to such embodiments, temperature measurement circuit 102 and current measurement circuit 106 share sense device 108 in order to determine both temperature and load current IL in load device 110. In other embodiments, the temperature measurement approaches described herein may also be applied to load device 110 instead of sense device 108. In still further embodiments, measurement system 100 may include two sense devices coupled to load device 110. In such embodiments, one sense device may be arranged for sensing current in the load device and the other sense device may be arranged for sensing temperature in the load device.

Figure 2:
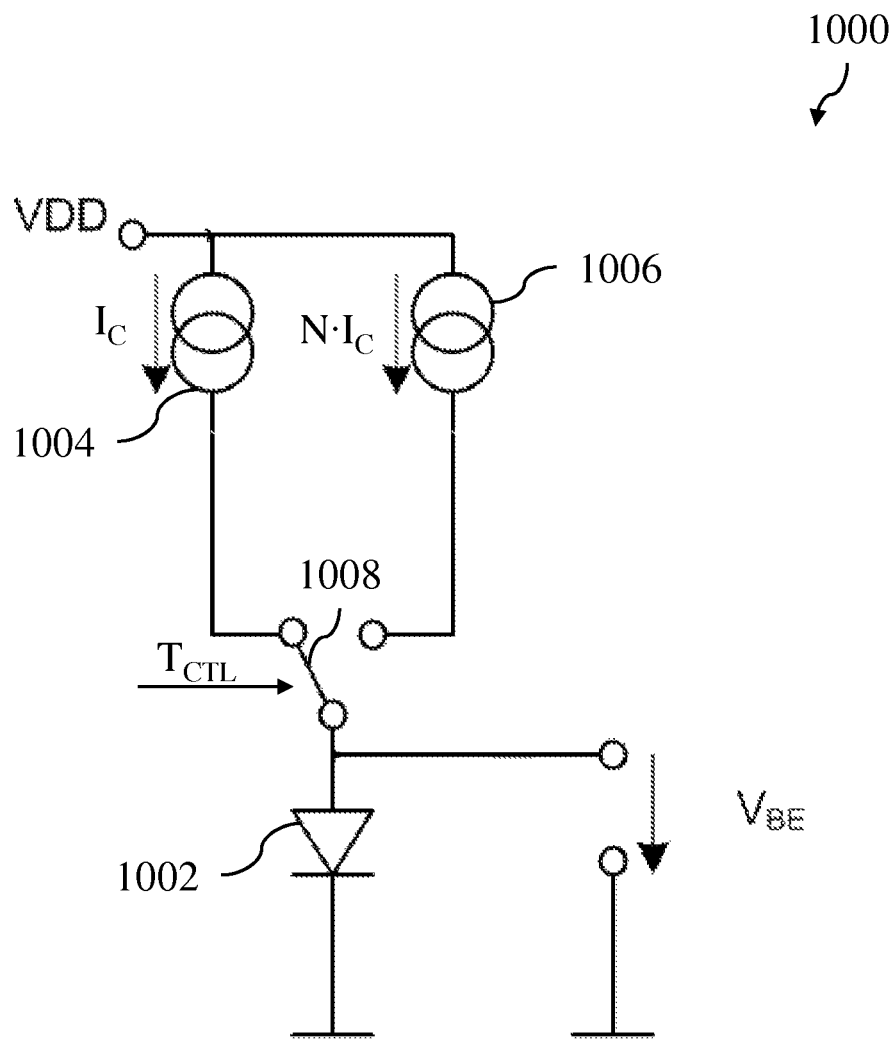
FIG. 2 illustrates a schematic of a diode circuit according to the prior art.

As discussed hereinabove, the relationship between voltage across a semiconductor junction and the temperature of the semiconductor junction may be used to determine the temperature based on a voltage measurement across the semiconductor junction. This approach may be applied to a diode junction and referred to as VBE temperature measurement or, in another case, a delta VBE temperature measurement. FIG. 2 illustrates a schematic of a diode circuit 1000 according to the prior art in order to demonstrate VBE temperature measurement calculations. Diode circuit 1000 includes semiconductor diode 1002, current sources 1004 and 1006 coupled to supply voltage VDD, and toggle switch 1008. Toggle switch 1008 is controlled by toggle control TCTL to switch between supplying forward current IC from current source 1004 or forward multiple current N·IC from current source 1006, where N is a factor for multiplying forward current IC.

When a current flows through a diode, the voltage drop VD across the diode is given by the equation:

$$V_D = n \cdot \frac{kT}{q} \cdot \ln\left(\frac{I_C}{I_S}\right)$$

Where n is the ideality factor, k is Boltzmann's constant, T is the temperature, q is the unit of elementary charge of an electron, IC is the forward current in the diode, and IS is the reverse bias saturation current of the diode. Voltage drop VD may also be referred to as base-emitter voltage VBE when the diode is part of a bipolar junction transistor (BJT) or a parasitic BJT in another type of transistor. As can be seen by the voltage drop equation, the temperature is a factor in determining voltage drop VD. When measuring the temperature using a single diode, the ideality factor n is known, the reverse bias saturation current IS is calculated, the forward current IC is measured, and the voltage drop VD is measured. However, reverse saturation current IS is dependent on a number of factors, including temperature. Thus, further derivations are performed in order to determine the temperature, as will be recognized by one of skill in the art. In such cases, determining the temperature from a single forward current may be referred to as a VBE temperature measurement.

However, diode circuit 1000 is configured to perform a delta VBE temperature measurement using two forward currents, IC and N·IC. Using the voltage drop equation above for both forward currents, using the base-emitter voltage VBE notation (as applied in a transistor) in place of VD, subtracting the resulting equations, and solving for temperature gives the resulting delta VBE temperature measurement equation for temperature:

$$T = \frac{(V_{BE1} - V_{BE2})}{\frac{nk}{q} \cdot \ln\left(\frac{1}{N}\right)}$$

Thus, diode circuit 1000 illustrates performing the delta VBE temperature measurement on semiconductor diode 1002 by controlling toggle switch 1008 using toggle control TCTL to supply forward current IC from current source 1004, measuring VBE1 across semiconductor diode 1002 while forward current IC is supplied, controlling toggle switch 1008 to supply forward multiple current N·IC from current source 1006, and measuring VBE2 across semiconductor diode 1002 while forward multiple current N·IC is supplied. Using the delta VBE temperature measurement equation above, the temperature may be accurately calculated.

VBE temperature measurements or delta VBE temperature measurements may be included in embodiment temperature measurement circuits and controllers described herein.

Figure 3:
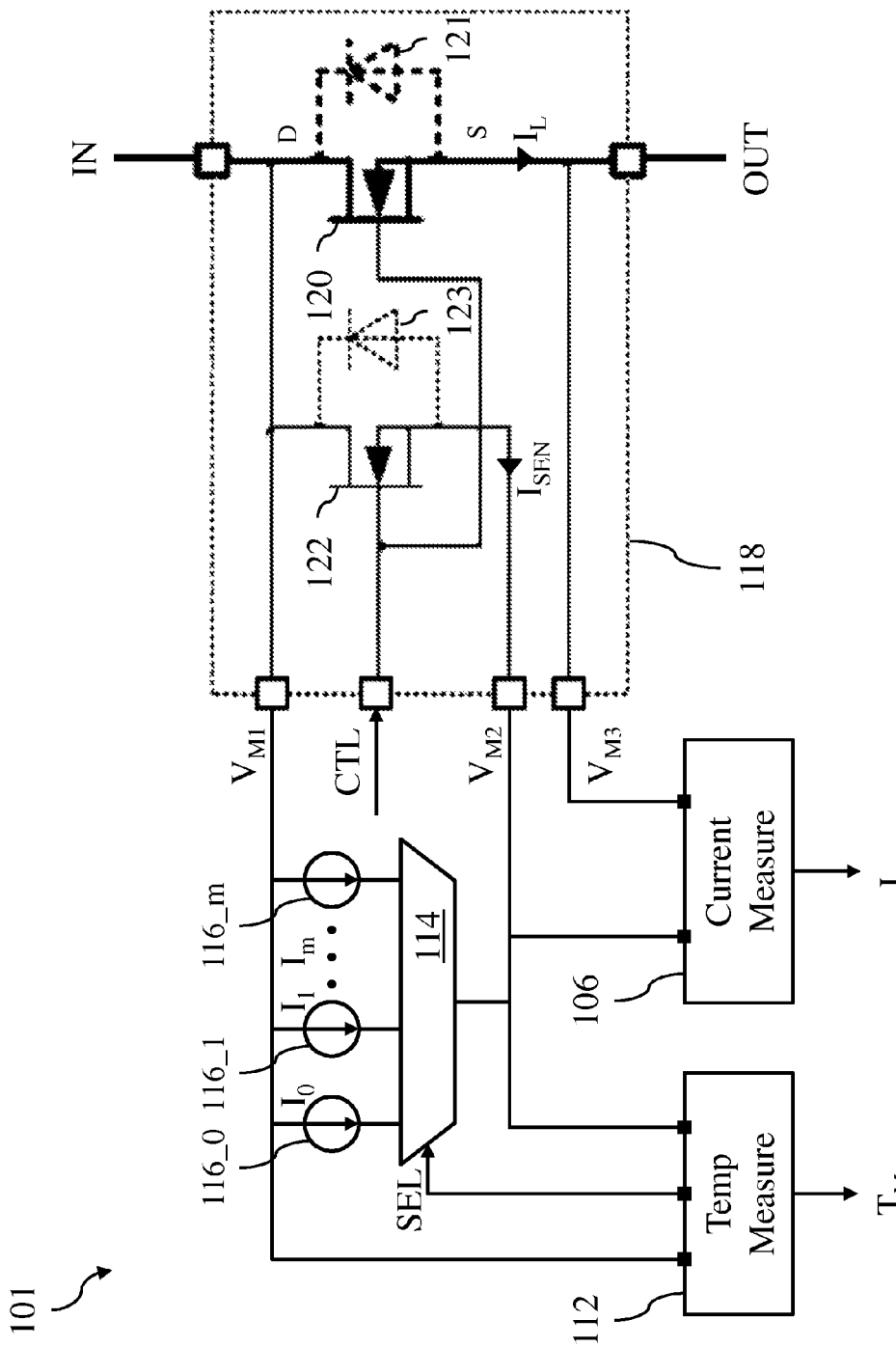
FIG. 3 illustrates a schematic of another embodiment measurement system.

FIG. 3 illustrates a schematic of another embodiment measurement system 101 including current measurement circuit 106, temperature measurement circuit 112, multiplexer 114, current sources 116_0, 116_1, . . . and 116_m, and semiconductor conduction device 118. Semiconductor conduction device 118 may include load transistor 120, which conducts load current IL between input load terminal IN and output load terminal OUT, and sense transistor 122. According to various embodiments, current measurement circuit 106 determines load current IL based on second measurement voltage VM2 and third measurement voltage VM3, as described hereinabove, and temperature measurement circuit 112 determines the temperature within semiconductor conduction device 118. In some embodiments, temperature measurement circuit 112 and current measurement circuit 106 may be operated alternatingly such that only one measurement circuit is active at a time.

In various embodiments, load transistor 120 and sense transistor 122 include body diode 121 and body diode 123, respectively. Control signal CTL controls both load transistor 120 and sense transistor 122 to conduct load current IL and sense current ISEN in a first direction. In such embodiments, temperature measurement circuit 112 may generate select signal SEL that controls multiplexer 114 to couple one of current sources 116_0-116_m to sense transistor 122 and body diode 123. Based on select signal SEL and multiplexer 114, one of current sources 116_0-116_m injects one, or a group, of currents I0, I1, . . . , and Im through body diode 123 in a second direction opposite the first direction. Temperature measurement circuit 112 measures first measurement voltage VM1 and second measurement voltage VM2 for each of injected currents I0-Im. In such embodiments, a based-emitter voltage VBE is equal to the difference between first measurement voltage VM1 and second measurement voltage VM2. Thus, base-emitter voltages VBE0, VBE1, . . . , and VBEm are determined for each of injected currents I0-Im. Based on the measured voltages (VB0-VBEm), temperature measurement circuit 112 may determine the temperature of sense transistor 122 using the delta VBE temperature measurement approach described hereinabove. In alternative embodiments, load transistor 120 and sense transistor 122 may be controlled with separate control signals, as described hereinabove in reference to FIG. 1, in order to independently control various measurement and conduction modes.

In various embodiments, current sources 116_0-116_m may be applied through multiplexer 114 in numerous variations. For example, in a first embodiment, currents I0-Im are all equal and multiplexer selects current source 116_0 for a first injection current I0 and a group of currents sources 116_1-116_m for a second injection current N·I0, where N is the multiple of the first current and corresponds to the number of current sources m in the group. The number of current sources m may be any number. For a specific example, when the number of current sources m in the group is 9, corresponding to 10 current sources total, the first injection current I0 is injected by current source 116_0 and the second injection current (N=9)·I0 is injected by the group of current sources 116_1-116_9. In other embodiments, the first group of injected currents may include any number or multiple of currents and the second group of injected currents may include any number or multiple of currents.

As another example, in a second embodiment, the first and second injected currents may be repeated numerous times and each injected current cycled through each current source. Cycling the current sources may minimize the influence of current source variations. In one particular embodiment, current sources 116_0-116_m are cycled according to a method referred to as dynamic element matching. In an example, the total number of current sources may be 9, with N=m=8, and the current supplied by each of current sources 116_0-116_8 is substantially equal, or equal within processing variations. In such an example embodiment, a first round is performed where the first injected current is current I0 from current source 116_0 and the second injected current is current (N=8)·I0 (equal to the sum of I1+I2+I3+I4+I5+I6+I7+I8) from current sources 116_1-116_8. Following the first round, a second round is performed where the first injected current is current I1 (where I1=I0) from current source 116_1 and the second injected current is current (N=8)·I0 (equal to the sum of I0+I2+I3+I4+I5+I6+I7+I8) from current sources 116_0 and 116_2-116_8. Following the second round, third, fourth, fifth, and additional rounds may be performed. In each round, the temperature of sense transistor 122 may be calculated using voltages measured while the first current is injected and while the second current is injected based on the delta VBE temperature measurement method described hereinabove. Based on the multiple rounds performed, the calculated temperatures from each round may be averaged for a more accurate temperature measurement.

In various embodiments, any number of current sources 116_0-116_m may be applied in any sequence to perform various types of delta VBE temperature measurements. In some embodiments, temperature measurement circuit 112 may include an analog calculation circuit that generates temperature signal TM based on the measured voltages. In other embodiments, temperature measurement circuit 112 may include a voltage measurement circuit, an analog to digital converter (ADC), and a digital calculation circuit that generates temperature signal TM based on the measured voltages. In a specific embodiment, the digital calculation circuit is a microcontroller that is coupled to sense transistor 122 and load transistor 120.

In specific embodiments, load transistor 120 and sense transistor 122 are field effect transistors (FETs), such as n-type or p-type FETs (NFET or PFET) with parasitic body diode 121 and parasitic body diode 123, respectively. In some embodiments, load transistor 120 and sense transistor 122 may be implemented as vertical or planar semiconductor devices or Fin type transistors (FinFETs). In one embodiment, load transistor 120 and sense transistor 122 are implemented as normally on transistors, such as JFETs for example. In the various embodiments, semiconductor conduction device 118 is formed in a single semiconductor substrate and sense transistor 122 is formed proximal with load transistor 120 in the semiconductor substrate. In a specific embodiment, load transistor 120 and sense transistor 122 are formed as different sized devices using the same semiconductor device structure. In some embodiments, load transistor 120 and sense transistor 122 are formed with the same geometry, but different transistor widths. In a specific embodiment, the ratio of the width of sense transistor 122 to the width of load transistor 120 range from 1:1000 to 1:50,000. In another embodiment, the ratio of the widths may range from 1:10,000 to 1:30,000. In other embodiments, the ratio of the widths is outside of these ranges.

In particular embodiments, the temperature of load transistor 120 is accurately determined based on determining the temperature of sense transistor 122, as described hereinabove, because load transistor 120 and sense transistor 122 are proximally integrated in the same semiconductor substrate. In an alternative embodiment, the embodiment temperature measurement approaches described hereinabove may be performed to directly measure the temperature of load transistor 120 using body diode 121, instead of using body diode 123 in sense transistor 122.

In other embodiments, select signal SEL may be supplied by another controller (not shown). As a further example, input load terminal IN may be coupled to a power supply or other power input circuit (not shown) and output load terminal OUT may be coupled to any type of electrical load or further switching stages in a power supply (not shown).

Figure 4:
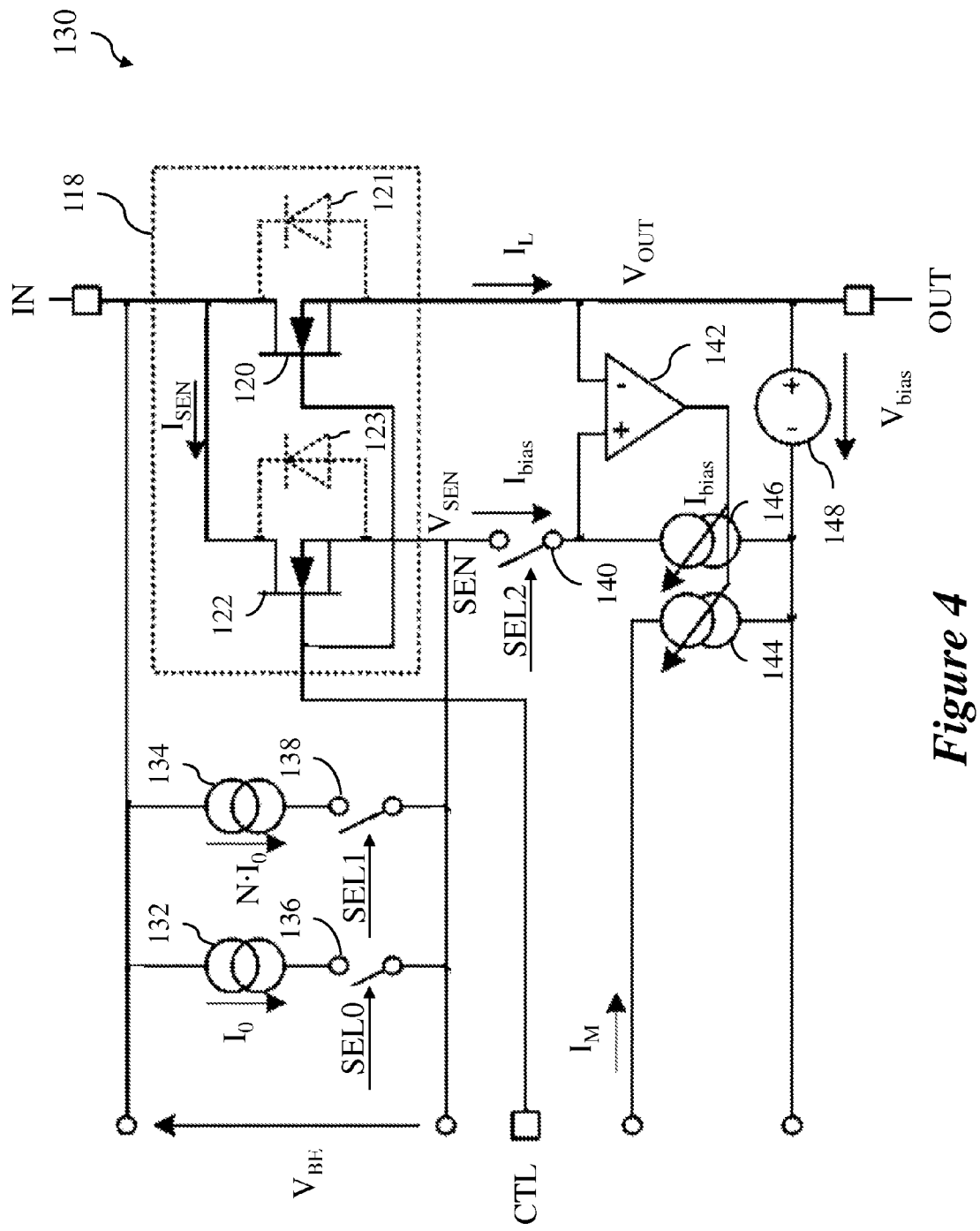
FIG. 4 illustrates a schematic of a further embodiment measurement system.

FIG. 4 illustrates a schematic of a further embodiment measurement system 130 including semiconductor conduction device 118, current source 132, current source 134, operational amplifier (opamp) 142, measurement current source 144, bias current source 146, and bias voltage source 148. Semiconductor conduction device 118 includes load transistor 120 and sense transistor 122, which are controlled by control signal CTL, as described further hereinabove. According to various embodiments, measurement system 130 illustrates a more detailed specific temperature and current measurement circuit. In such embodiments, switches 136 and 138 are controlled by select signal SEL0 and SEL1 to inject current I0 and N·I0, respectively, into body diode 123 of sense transistor 122. When each injected current I0 and N·I0 is injected, a voltage measurement circuit (not shown) coupled to a temperature calculation circuit (not shown) measures base emitter voltage VBE, such as VBE1 for current I0 and VBE2 for current N·I0, for performing the delta VBE temperature measurement approach described hereinabove. In some embodiments, N ranges from 2 to 32. In other embodiments, N is greater than 32. In some embodiments, N is only integer multiples or approximately integer multiples. In other embodiments, N includes non-integer multiples.

In other embodiments, other configurations of current sources with switches or select signals are used as described in reference to FIG. 3, for example. In a still further embodiment, a controllable current source may be used in place of current source 132, current source 134, switch 136, and switch 138, as described in reference to FIG. 1, for example.

According to various embodiments, switch 140, opamp 142, measurement current source 144, bias current source 146, and bias voltage source 148 implement a current measurement circuit using sense transistor 122. In such embodiments, switch 136 or switch 138 is closed, or in a conducting state, and switch 140 is open, or in a non-conducting state, when a temperature measurement is performed for sense transistor 122. Similarly, switch 136 and 138 are open and switch 140 is closed when a current measurement is performed using sense transistor 122.

In various embodiments, sense transistor 122 is configured to generate sense current ISEN proportional to load current IL based on the ratio of transistor sizes between load transistor 120 and sense transistor 122, which may range from 1:1000 to 1:50,000, for example, as described hereinabove. In such embodiments, when switch 140 is closed, bias current source 146 conducts bias current Ibias as sense current ISEN. Opamp 142 receives output voltage VOUT from output load terminal OUT and sense voltage VSEN from sense node SEN and controls bias current Ibias such that both voltages are equal. For example, when sense voltage VSEN is higher than output voltage VOUT, bias current Ibias is increased in order to decrease sense voltage VSEN. When sense voltage VSEN is lower than output voltage VOUT, bias current Ibias is decreased in order to increase sense voltage VSEN. The output signal of opamp 142 also controls measurement current source 144 to generate measurement current IM. Measurement current source 144 and bias current source 146 are matched current sources, e.g., configured as a current minor, in order that measurement current IM is proportional to bias current Ibias. Thus, in such embodiments, measurement current IM is proportional to bias current Ibias and, consequently, also proportional to load current IL. In various embodiments, the proportionality is based on the ratio of transistor sizes between sense transistor 122 and load transistor 120 and the minoring ratio between measurement current source 144 and bias current source 146. In various embodiments, bias voltage source 148 biases measurement current source 144 and bias current source 146. In such embodiments, bias voltage source 148 provides an adequate voltage drop over bias current source 146 in order to enable proper operation.

According to some embodiments, opamp 142 controls measurement current source without adding any series resistance to the load path to output load terminal OUT. Thus, measurement current IM may be measured with a transimpedance amplifier or a shunt resistor, for example, without affecting the load path. Based on measurement current IM, load current IL may be calculated using the proportional relationship between measurement current IM and load current IL.

Figure 5:
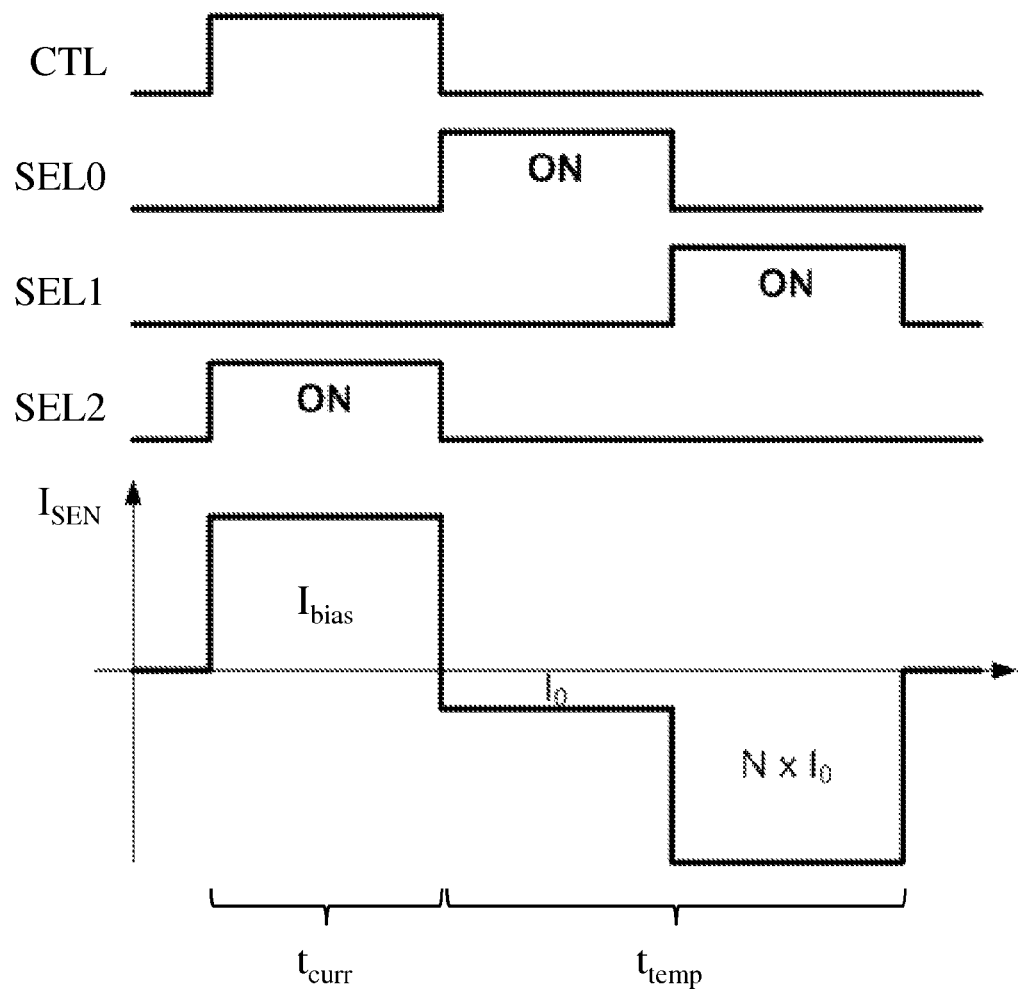
FIG. 5 illustrates a waveform diagram of an embodiment measurement system in operation.

FIG. 5 illustrates a waveform diagram of an embodiment measurement system 130 in operation. According to various embodiments, FIG. 5 illustrates an embodiment measurement system, first, in a current measuring operation or mode during time $t_{curr}$ and, second, in a temperature measuring operation or mode during time $t_{temp}$. During the current measuring mode in time $t_{curr}$, the load transistor and the sense transistor, such as load transistor 120 and sense transistor 122, are activated by control signal CTL to turn on, or operate in a conducting state. While control signal CTL is on in time $t_{curr}$, select signal SEL2 is turned on in order to close switch 140 and conduct bias current Ibias as sense current ISEN through switch 140. As shown, while select signal SEL2 is turned on, sense current ISEN is equal to bias current Ibias. During time $t_{curr}$, a current measurement may be performed using opamp 142 and measurement current source 144 to generate measurement current IM, as described above in reference to FIG. 4.

In various embodiments, following the current measurement during time $t_{curr}$, a temperature measurement may be performed during time $t_{temp}$. For the temperature measurement, select signal SEL2 is turned off, opening switch 140, and control signal CTL is also turned off, causing load transistor 120 and sense transistor 122 to operate in the off state. At the same time, in the first half of time $t_{temp}$, select signal SEL0 is turned on, closing switch 136, in order to inject reverse current I0 from current source 132 into body diode 123. During the time while current I0 is injected into body diode 123, VBE1 may be measured across sense transistor 122, as described above in reference to FIG. 4.

According to various embodiments, during the second half of time $t_{temp}$, select signal SEL0 is turned off, opening switch 136, and select signal SEL1 is turned on, closing switch 138, in order to inject reverse current N·I0 from current source 134 into body diode 123. During the time while current N·I0 is injected into body diode 123, VBE2 may be measured across sense transistor 122. As shown in FIG. 5, sense current ISEN flowing in sense transistor 122 during time $t_{temp}$ is equal to current I0 for the first half of time $t_{temp}$ and equal to current N·I0 for the second half of time $t_{temp}$. Further, sense current ISEN during current measurement mode in time $t_{curr}$ is opposite in polarity compared to sense current ISEN during temperature measurement mode in time $t_{temp}$. This corresponds to conducting a current in the first direction through the conduction path of sense transistor 122 and conducting a current in the second direction, opposite the first, through the parasitic body diode of sense transistor 122.

In some embodiments, the current measurement mode and time $t_{curr}$ may be any time length and the temperature measurement mode and time $t_{temp}$ may be any time length. In some specific embodiments, the time lengths are on the order of the switching frequency of control signal CTL and load transistor 120. In still more specific embodiments, times $t_{curr}$ and $t_{temp}$ range from 500 ns to 50 us. In other embodiments, times $t_{curr}$ and $t_{temp}$ are outside this range. Other embodiment measurement systems may be operated in a similar manner as depicted in FIG. 5 for measurement system 130.

Figure 6A:
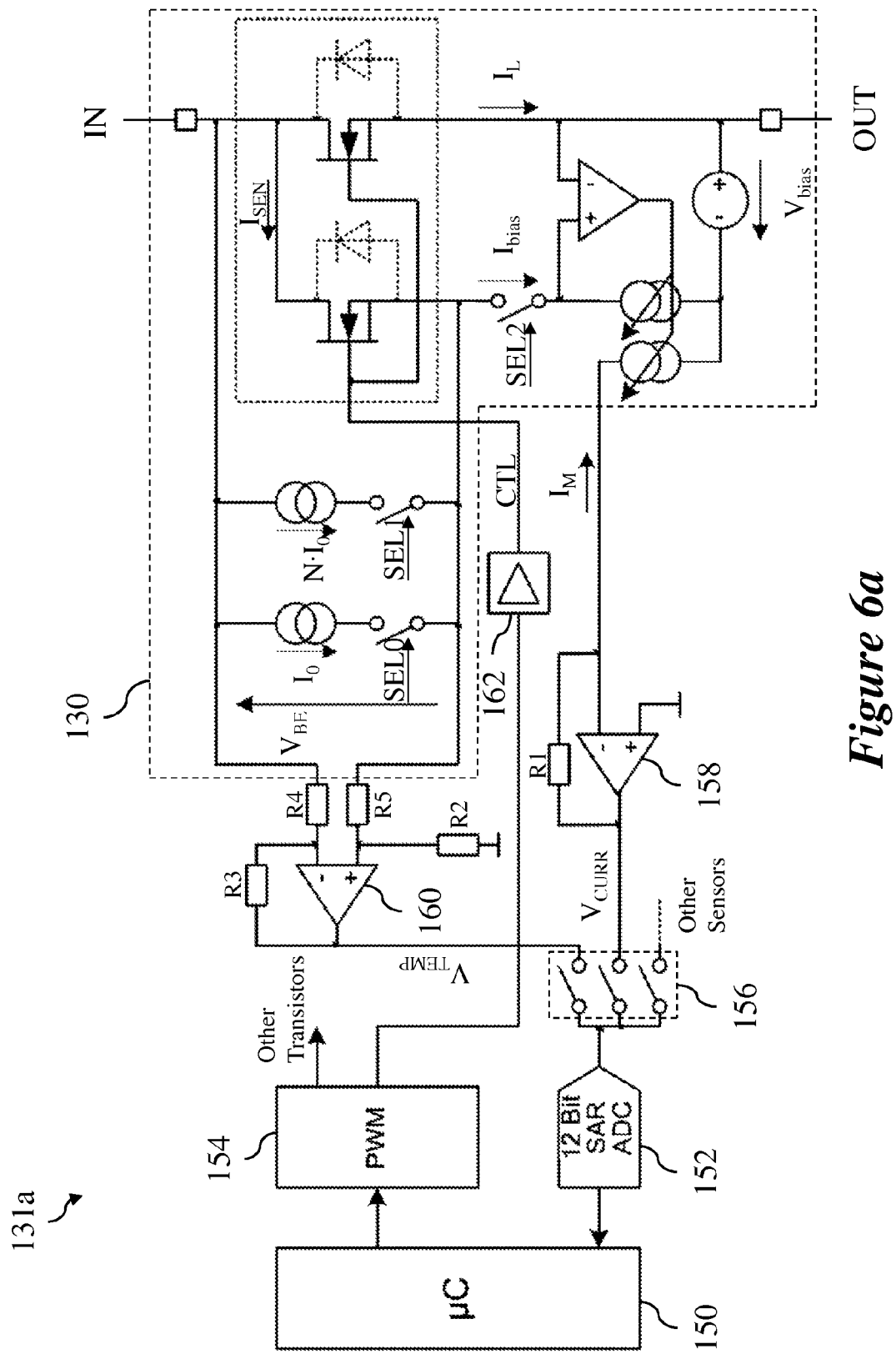
FIGS. 6a and 6b illustrate schematics of embodiment switching and measurement systems.

FIG. 6a illustrates a schematic of an embodiment switching and measurement system 131a including measurement system 130, as described above in reference to FIGS. 4 and 5, along with voltage measurement circuits, microcontroller 150, analog to digital converter (ADC) 152, multiplexing switch 156, and pulse width modulator (PWM) 154. According to various embodiments, measurement system 130 operates as described above and the other components provide an embodiment interface for a complete switching and measurement system 131. Opamp 158 and resistor R1 operate as a transimpedance amplifier to convert measurement current IM into current measurement voltage VCURR. Similarly, opamp 160 and resistors R2, R3, R4, and R5 operate as a floating voltage measurement circuit to measure base-emitter voltage VBE and output the measured voltage as temperature measurement voltage VTEMP.

In various embodiments, multiplexing switch 156 receives current measurement voltage VCURR and temperature measurement voltage VTEMP and selects between them to couple one of the measurement voltages to ADC 152, which supplies a converted digital signal to microcontroller 150. In some embodiments, microcontroller 150 performs calculations to determine the load current IL and the temperature of sense transistor 122 and load transistor 120. For example, microcontroller 150 may perform the calculations for the delta VBE temperature measurement approach described above in reference to FIG. 2.

According to some embodiments, microcontroller 150 controls PWM 154 in order to generate switching control signal CTL for switching load transistor 120 and sense transistor 122. Control signal CTL may be generated at PWM 154 and driven through gate driver 162. PWM 154 may also generate control signals for other transistors (not shown) in a larger system, such as in a half-bridge switching circuit, for example.

In specific embodiments, ADC 152 may be a 12 bit successive approximation ADC, for example. In other embodiments, ADC 152 may be other types of ADCs and include more or less bits. Further, multiplexing switch 156 is controlled by a control circuit, such as microcontroller 150, and may be a multiplexer or another type of switch configuration. In some embodiments, multiplexing switch 156 may receive measurement signals from other sensors (not shown) in a larger system. For example, multiplexing switch 156 may receive temperature and current voltage signals from other transistors in a switched mode power supply (SMPS) that includes multiple transistors, such as in a half-bridge or full-bridge configuration.

Figure 6B:
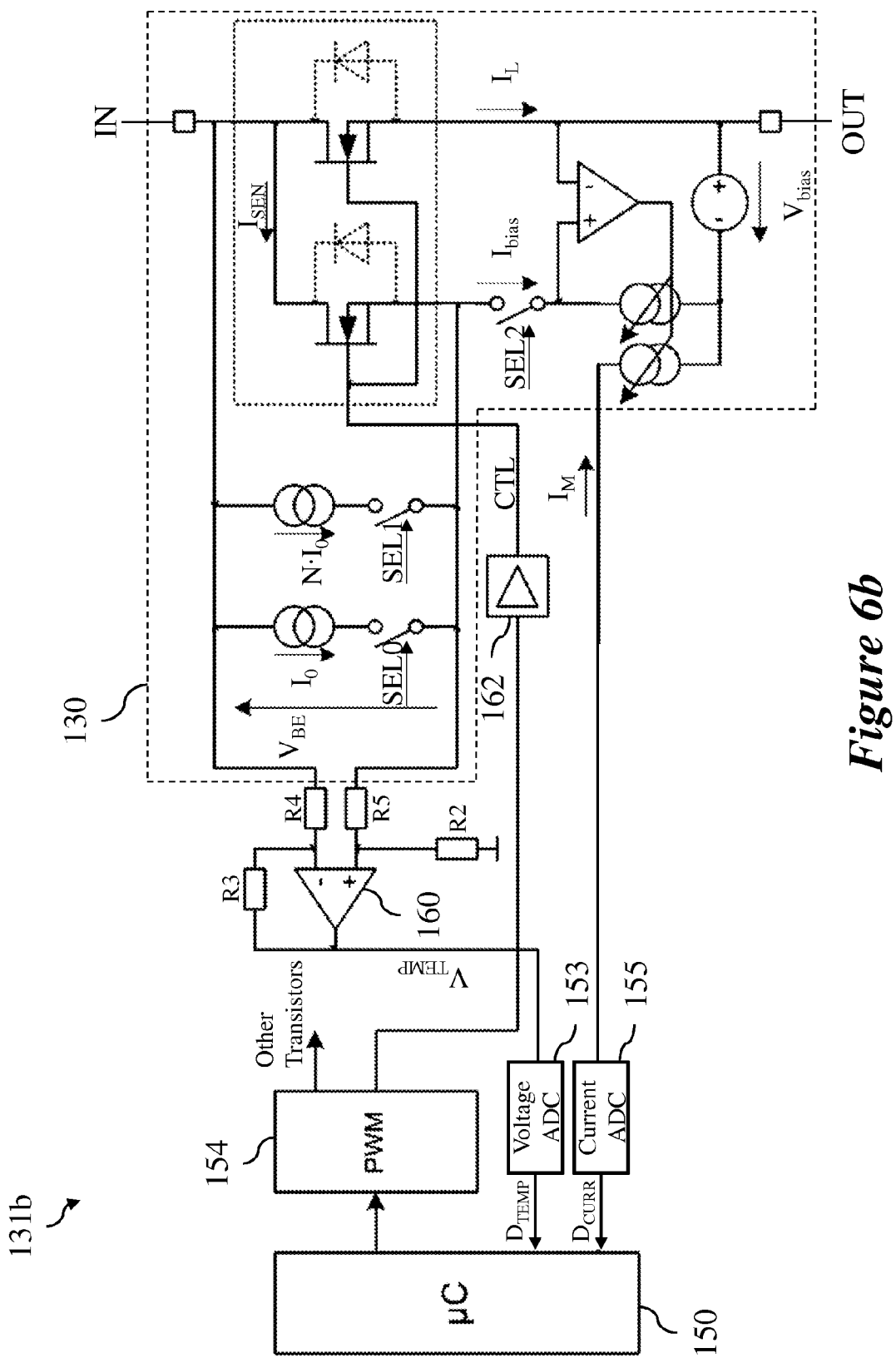

FIG. 6b illustrates a schematic of another embodiment switching and measurement system 131b including measurement system 130, as described above in reference to FIGS. 4 and 5, along with voltage measurement circuits, microcontroller 150, voltage ADC 153, current ADC 155, and pulse width modulator (PWM) 154. Switching and measurement system 131b includes the same elements as switching and measurement system 131a as described hereinabove in reference to FIG. 6a with the exception of voltage ADC 153 and current ADC 155 for interfacing with microcontroller 150. According to various embodiments, current ADC 155 receives measurement current IM directly and provides digital current signal DCURR, corresponding to measurement current IM, to microcontroller 150. Similarly, voltage ADC 153 receives temperature measurement voltage VTEMP from opamp 160 and provides digital temperature signal DTEMP, corresponding to temperature measurement voltage VTEMP, to microcontroller 150. In such embodiments, a multiplexer is avoided and each ADC directly interfaces with microcontroller 150. In other embodiments, a multiplexer and a single interface may be used. In various embodiments, voltage ADC 153 and current ADC 155 may be implemented as various types of ADCs such as 12-bit, 16-bit, 24-bit ADCs and may be implemented as successive approximation register ADCs, for example.

Figure 7:
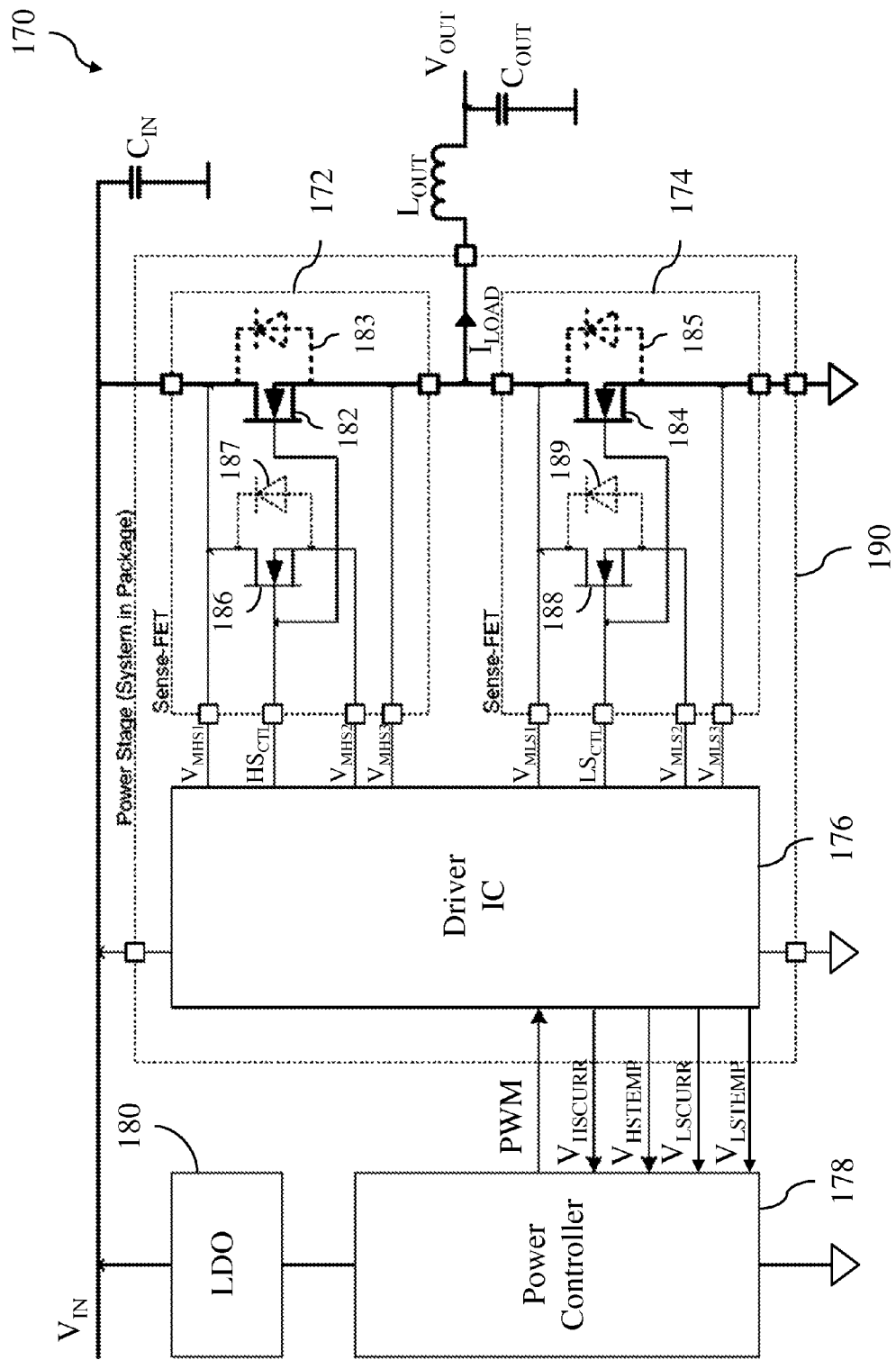
FIG. 7 illustrates a schematic of an embodiment switching system

FIG. 7 illustrates a schematic of an embodiment switching system 170 that includes embodiment measurement systems described herein. Switching system 170 includes high side semiconductor conduction device 172, low side semiconductor conduction device 174, driver integrated circuit (IC) 176, power controller 178, and low-dropout (LDO) regulator 180. According to various embodiments, power controller 178 provides pulse width modulated switching drive signal PWM to driver IC 176. Based on drive signal PWM, driver IC 176 provides high side control signal HSCTL to high side transistor 182 and high side sense transistor 186 in high side semiconductor conduction device 172, and also provides low side control signal LSCTL to low side transistor 184 and low side sense transistor 188 in low side semiconductor conduction device 174.

In various embodiments, high side transistor 182 and low side transistor 184 are controlled by driver IC 176 and power controller 178 to convert input voltage VIN by alternatingly switching and conducting ILOAD through output inductor LOUT to supply output voltage VOUT. Output inductor LOUT and output capacitor COUT operate as filtering elements for implementing various switching operations. In some embodiments, the half-bridge configuration including high side transistor 182 and low side transistor 184 is coupled through output inductor LOUT to another half-bridge configuration, forming a full-bridge switching circuit.

According to various embodiments, driver IC 176 includes temperature and current measurement circuits and is configured to perform temperature and current measurements, as described herein, for high side semiconductor conduction device 172 or low side semiconductor conduction device 174 based on high side voltage measurements VMHS1, VMHS2, and VMHS3 for the high side and low side voltage measurements VMLS1, VMLS2, and VMLS3 for the low side. In some embodiments, driver IC 176 generates current measurement voltage VCURR and temperature measurement voltage VTEMP and supplies both voltages to power controller 178. In a specific embodiment, driver IC 176 generates high side current measurement voltage VHSCURR and high side temperature measurement voltage VHSTEMP for high side semiconductor conduction device 172 and generates low side current measurement voltage VLSCURR and low side temperature measurement voltage VLSTEMP for low side semiconductor conduction device 174. Power controller 178 may perform calculations for determining current or temperature values based on current measurement voltage VCURR (high side VHSCURR or low side VLSCURR) and temperature measurement voltage VTEMP (high side VHSTEMP or low side VLSTEMP). For example, power controller 178 may perform the delta VBE temperature measurement calculations. In some embodiments, power controller 178 may be implemented as a microcontroller or an application specific integrated circuit (ASIC).

According to various embodiments, power controller 178 is supplied with a regulated voltage such as, e.g., 3.3 V, by LDO regulator 180. Input capacitor CIN may stabilize input voltage VIN. In some embodiments, power stage 190 includes driver IC 176, high side semiconductor conduction device 172, and low side semiconductor conduction device 174. Power stage 190 may be a system in package, including each element in a single package. In an alternative embodiment, power stage 190 is a single IC. In some specific embodiments, power stage 190 may include only a single high side semiconductor conduction device 172 or a single low side semiconductor conduction device 174 as either a single IC or as a system in package.

Figure 8:
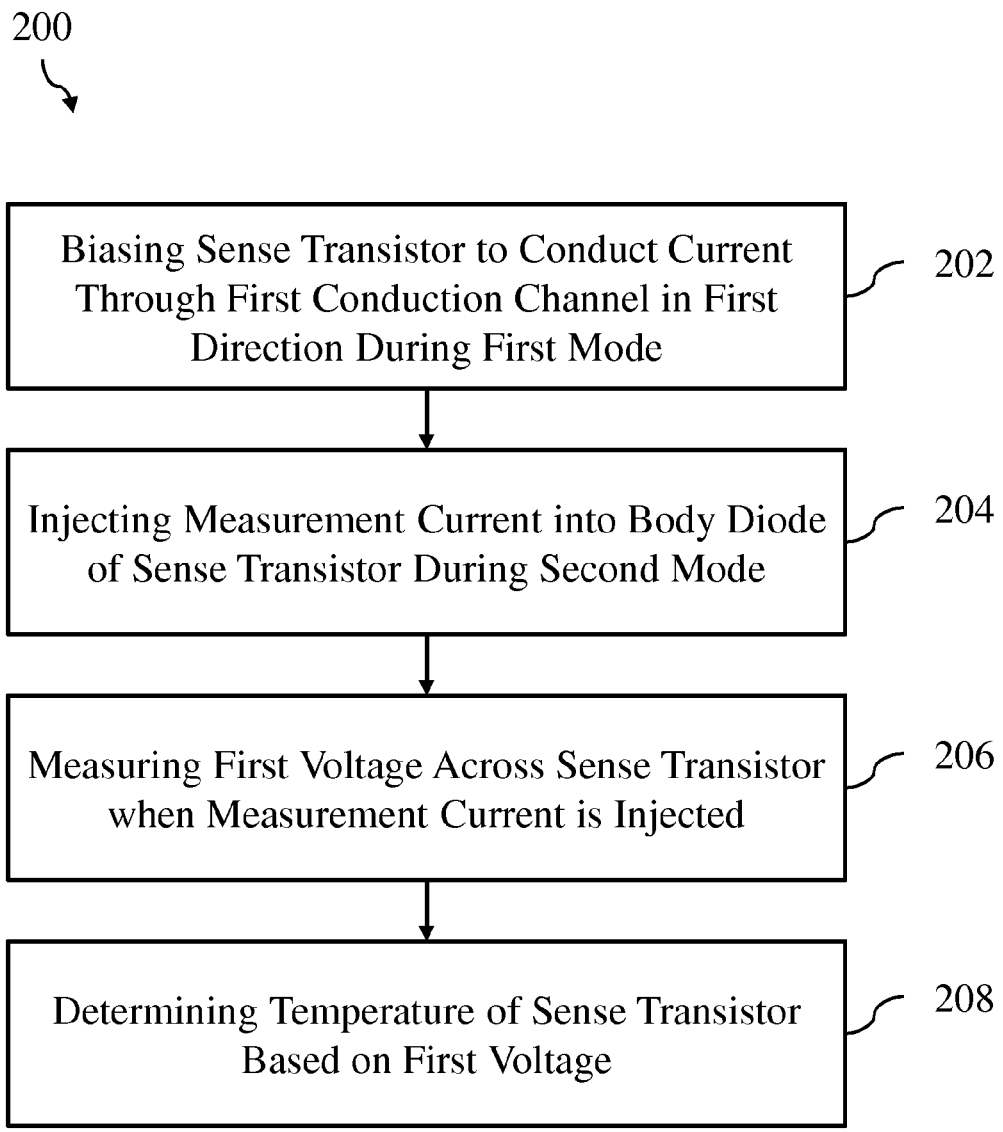
FIG. 8 illustrates a block diagram for an embodiment method of operating a measurement system.

FIG. 8 illustrates a block diagram for an embodiment method of operation 200 for operating an embodiment measurement system in steps 202-208. According to an embodiment, step 202 includes biasing a sense transistor to conduct current through a first conduction channel in a first direction during a first mode. In such embodiments, the sense transistor is integrated in a semiconductor body with a load transistor that has a second conduction channel. The first conduction channel and the second conduction channel are coupled to an input node. In such embodiments, the first mode may be a current conduction mode or current measurement mode. Step 204 includes injecting a measurement current into a body diode of the sense transistor during a second mode. The measurement current is injected in a second direction opposite the first direction. In such an embodiment, the first mode includes conducting current in the first direction through the conduction channel of the sense transistor and the second mode includes injecting current in the second direction through or into the body diode of the sense transistor. The second mode may be a temperature measurement mode. In one specific example embodiment, the sense transistor is a power MOSFET and current is injected through the parasitic body diode of the power MOSFET in the second mode.

According to an embodiment, step 206 includes measuring a first voltage across the sense transistor when the measurement current is injected into the body diode. The first voltage may be referred to as the base-emitter voltage VBE in some embodiments. Step 208 includes determining a temperature of the sense transistor based on the first voltage. In such embodiments, determining the temperature may include performing the VBE temperature measurement approach as described further hereinabove. In other embodiments, multiple currents may be injected into the body diode, base-emitter VBE voltages may be measured for each current injected, and a delta VBE temperature measurement approach may be performed, as described further hereinabove. In alternative embodiments, method of operation 200 may be performed on the load transistor instead of the sense transistor. In such cases, the sense transistor may be removed.

In other embodiments, additional steps may be added to method of operation 200 or the steps may be rearranged to follow another sequence. In one embodiment, additional steps may be added for performing a current measurement in the first mode when the current is conducted through the conduction channel of the transistor.

Figure 9A:
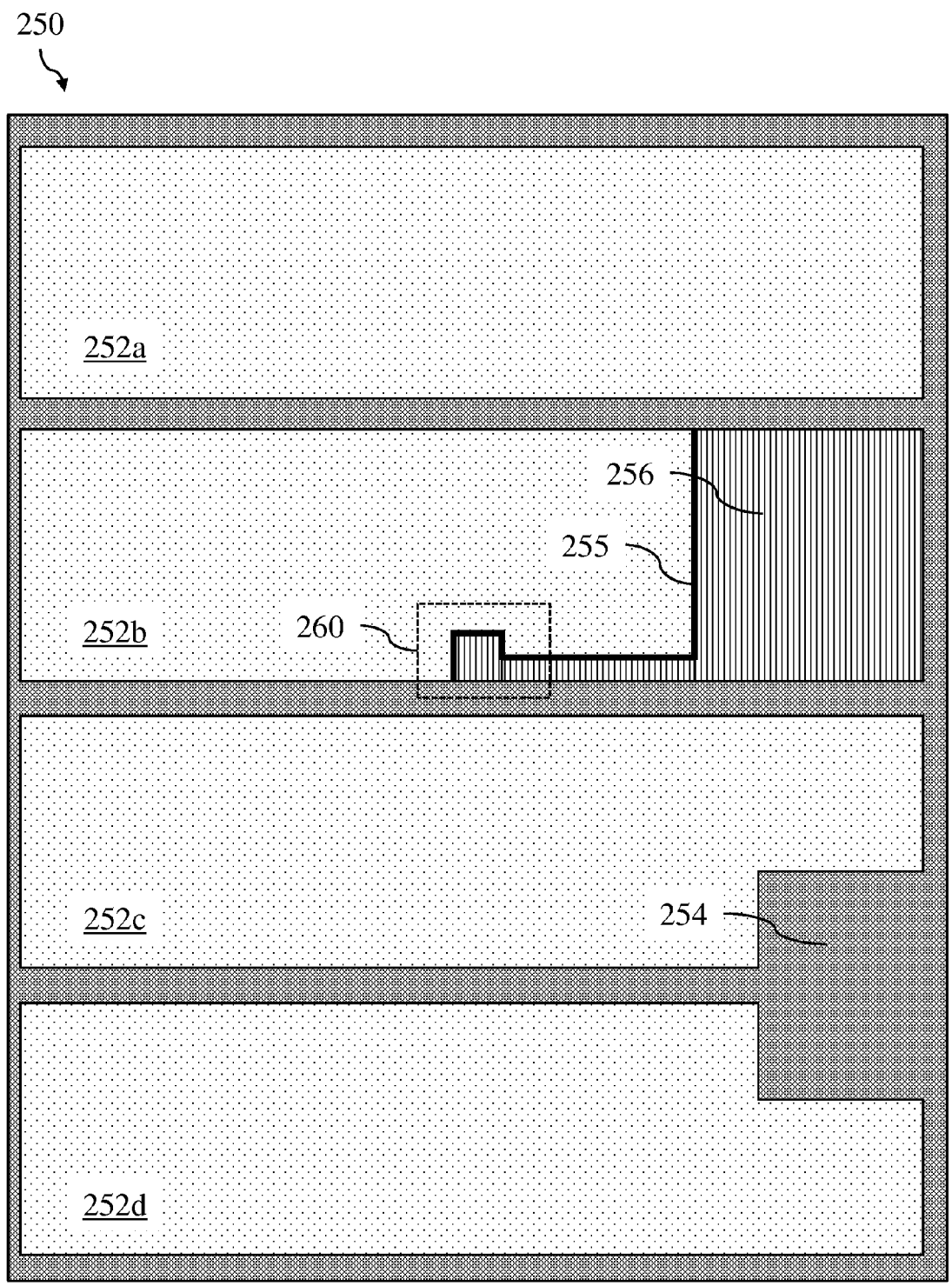
FIGS. 9a, 9b, and 9c illustrate schematic diagrams of example semiconductor devices used in embodiment measurement systems.
Figure 9B:
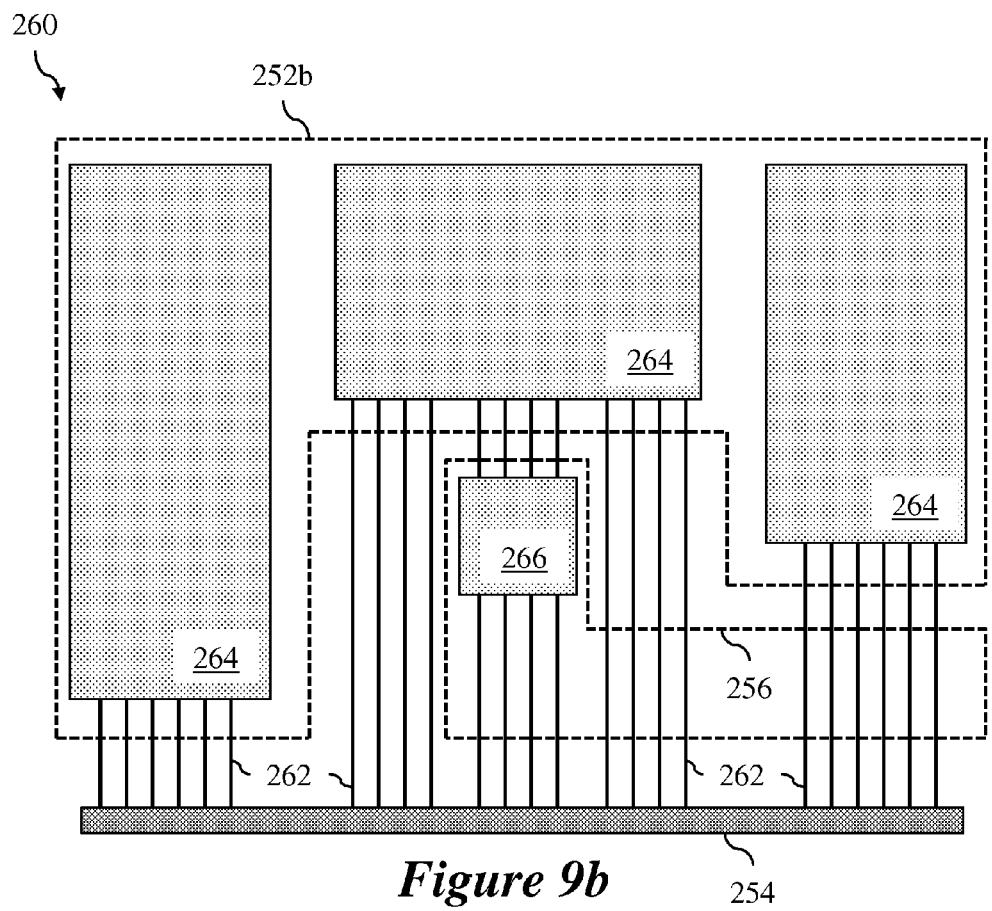
Figure 9C:
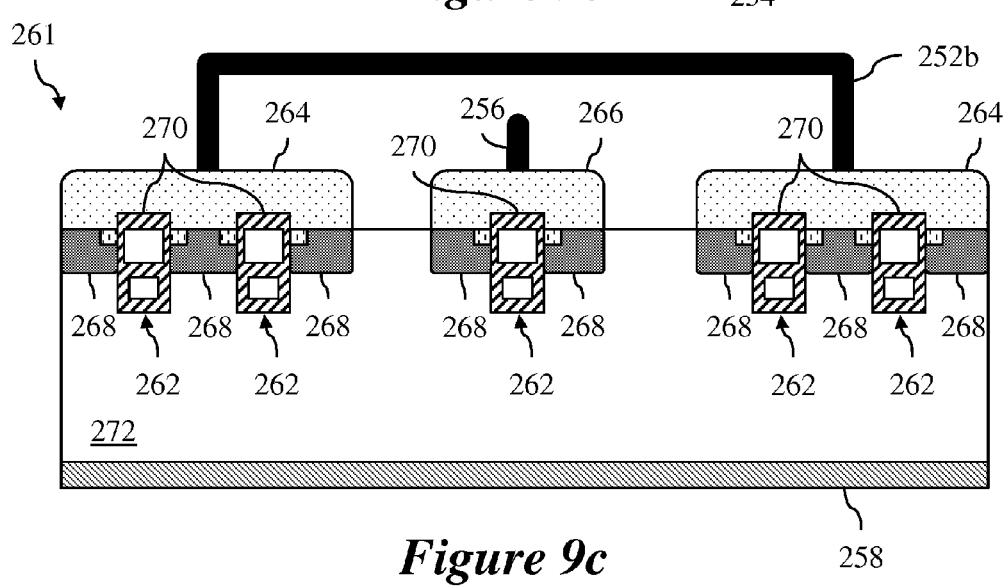

FIGS. 9a, 9b, and 9c illustrate schematic diagrams of example semiconductor devices used in embodiment measurement systems. According to various embodiments, FIGS. 9a, 9b, and 9c are illustrative examples of a load transistor and sense transistor configuration. These figures are not drawn to scale and omit various details and variations known to those of skill in the art. FIG. 9a illustrates a top view of semiconductor device 250 including load source contacts 252a, 252b, 252c, and 252d, gate runner 254, and sense source contact 256. Semiconductor device 250 is one implementation of a trench gate vertical power MOSFET that includes a load transistor and a sense transistor. The load transistor is formed between load source contacts 252a, 252b, 252c, and 252d and drain 258 (not shown, see FIG. 9c) and is controlled by signals applied through gate runner 254, which is coupled to multiple gate lines 262 (not shown, see FIGS. 9b and 9c) running beneath gate runner 254. The sense transistor is formed in the same semiconductor between sense source contact 256 and drain 258 and also is controlled by the same signals applied through gate runner 254. Isolation region 255 separates sense source contact 256 from load source contact 252b.

In various embodiments, multiple source contacts may be used of multiple sizes. Although four load source contacts are shown, any number may be included. The ratio of transistor width for the sense transistor to transistor width for the load transistor may be set to the range from 1:1000 to 1:50,000. The ratio may be further narrowed to the range from 1:10,000 to 1:30,000. In alternative embodiments, the ratio may be outside of these ranges.

FIG. 9b illustrates an expanded top view of semiconductor device 250 in region 260, which depicts source contact 252b overlying load sources 264 with gate lines 262. FIG. 9b also depicts sense source contact 256 overlying sense source 266 with gate lines 262. The number of gate lines 262 may vary from a small number of a large number. Further, the ratio of transistor widths may be approximately related to the ratio of the number of gates lines 262 with sense source 266 to the number of gate lines 262 with load source 264. As described above, this ratio may be greater than 1:1000. In some alternative embodiments, the ratio may also be less than 1:1000. Only a small number of gate lines 262 are illustrated in order to improve simplicity. Gate runner 254 contacts gate lines 262 and provides the same signals to the gates of many load and sense transistors. As those skilled in the art will recognize, semiconductor device 250 depicts a larger vertical MOSFET formed of multiple smaller transistors connected in parallel.

FIG. 9c illustrates a schematic cross section 261 of region 260. Cross section 261 has been further reduced for simplicity and only illustrates a single gate line 262 for sense source 266 and four gate lines 262 for load sources 264. As described above, there may be larger numbers of gate lines for sense source 266 and for load source 264. For example, some embodiments may include 10 gate lines 262 for sense source 266 and 10,000 gate lines for load source 264. Gate lines 262 are separated from load source 264 and sense source 266 by insulation material 270, which may be formed of an oxide, for example. Doped regions 268 are formed below sense source 266 and load source 264. In different embodiments, doped regions 268 may be p-type or n-type doped regions and may also include both doped p- or n-wells and higher doped n+ or p+ regions inside the wells, depending on the well and semiconductor dopants. Drain 258 is formed as a body contact in semiconductor substrate 272.

In the illustrated embodiment, gate lines 262 are depicted with a gate electrode overlying a field electrode, with both electrodes surrounded by insulation material 270. This illustrated embodiment is one type of trench gate vertical transistor. In other embodiments, only a gate electrode is used and the field electrode is omitted from the trench. In further embodiments, a planar vertical transistor may be used. In still further alternative embodiments, any type of power transistor with any type of structure may be used. As discussed hereinabove, FIGS. 9a, 9b, and 9c are illustrative examples that omit various details and variations that will be apparent to those of skill in the art.

According to various embodiments, gate lines 262 control both the sense transistor formed between sense source 266 and drain 258 and the load transistor formed between load source 264 and drain 258. Thus, the sense transistor and load transistor have shared gate and drain connections with separate source connections, as described herein above in reference to the other figures. Sense source contact 256 and load source contact 252b are shown schematically in cross section 261 in order to illustrate shared connections; however, load source contact 252b does not necessarily overlie sense source contact 256 as shown, but may be formed with a metallization pattern as shown in FIG. 9b. Sense source contact 256 and load source contact 252b may be defined by metallization levels, as is apparent to those of skill in the art. In various embodiments, the sense transistor described herein in reference to FIGS. 9a, 9b, and 9c may be used to sense current or temperature, as described hereinabove in reference to the other figures. According to some embodiments, semiconductor device 250 may include two sense transistors formed in a similar manner as the single sense transistor depicted in FIGS. 9a, 9b, and 9c. In such embodiments, the two sense transistors may be used to sense current and temperature separately.

According to an embodiment, a method of operating a measurement circuit includes biasing a sense transistor to conduct current through a first conduction channel in a first direction during a first mode, injecting a measurement current into a body diode of the sense transistor during a second mode, measuring a first voltage across the sense transistor when the measurement current is injected, and determining a temperature of the sense transistor based on the first voltage. When the measurement current is injected, it is injected in a second direction opposite the first direction. The sense transistor is integrated in a semiconductor body with a load transistor having a second conduction channel, and the first conduction channel and the second conduction channel are coupled to an input node.

In various embodiments, the sense transistor has a first control terminal coupled to a switching control input and the load transistor has a second control terminal coupled to the switching control input. The method may also include providing a bias current to the first conduction channel during the first mode, measuring a second voltage between the sense node and the output node during the first mode, and determining a current flowing in the second conduction channel based on the second voltage. In such embodiments, the first conduction channel is coupled to a sense node and the second conduction channel is coupled to an output node.

In various embodiments, injecting the measurement current includes injecting a plurality of measurement currents into the body diode of the sense transistor during the second mode, measuring the first voltage includes measuring a plurality of voltages across the sense transistor when the plurality of measurement currents are injected, and determining the temperature of the transistor includes determining the temperature of the transistor based on the plurality of voltages. In such embodiments, the plurality of measurement currents is injected in the second direction. Determining the temperature of the transistor based on the plurality of voltages may include providing the plurality of voltages through a floating voltage measurement circuit to a controller and calculating the temperature based on a voltage difference of the plurality of voltages.

According to an embodiment, a measurement circuit includes a first circuit configured to be coupled to a transistor and configured to bias the transistor to conduct current through a first conduction channel in a first direction, a controllable current source configured to be coupled to the transistor, and a temperature measurement circuit configured to be coupled to the transistor. The controllable current source is also configured to inject a first measurement current into a body diode of the transistor, where the first measurement current is injected in a second direction opposite the first direction. The temperature measurement circuit is configured to measure a first voltage across the transistor when the first measurement current is injected, and determine a temperature of the transistor based on the first voltage.

In various embodiments, the controllable current source is also configured to inject a second measurement current into the transistor to conduct current through the body diode in the second direction. The temperature measurement circuit may be further configured to measure a second voltage across the transistor when the second measurement current is applied and determine the temperature of the transistor based on the first voltage and the second voltage. In such an embodiment, the second measurement current may be a multiple of the first measurement current.

In various embodiments, the controllable current source is configured to inject a plurality of measurement currents into the transistor to conduct current through the body diode in the second direction, and the temperature measurement circuit is configured to measure a plurality of voltages across the transistor when the plurality of measurement currents are applied and determine the temperature of the transistor based on the first voltage and the plurality of voltages. The transistor may include a sense transistor with a first conduction terminal coupled to an input node, a second conduction terminal, and a control terminal coupled to a switching control input. In such an embodiment, the sense transistor is configured to be coupled to a load transistor with a first conduction terminal coupled to the input node, a second conduction terminal, and a control terminal coupled to the switching control input. The sense transistor and the load transistor are integrated in a same semiconductor substrate.

In further embodiments, the measurement circuit also includes a current measurement circuit configured to be coupled to the second conduction terminal of the sense transistor and configured to be coupled to the second conduction terminal of the load transistor. In such embodiments, the current measurement circuit is configured to determine the current in the load transistor based on a voltage difference between the second conduction terminal of the load transistor and the second conduction terminal of the sense transistor. The measurement circuit may also include the sense transistor and the load transistor.

In still further embodiments, the first circuit includes a control circuit configured to, during a temperature measurement mode, activate the controllable current source to inject the first measurement current into the second conduction terminal of the sense transistor, and deactivate the current measurement. The control circuit is also configured to, during a current measurement mode, activate the current measurement circuit to bias the sense transistor to conduct current through the first conduction channel, and deactivate the controllable current source.

In yet further embodiments, the control circuit is coupled to the switching control input and configured to enable and disable the load transistor and the sense transistor such that the load transistor supplies a load current to a load and the sense transistor generates a sense current proportional to the current in the load transistor. The control circuit may include a microcontroller coupled to the temperature measurement circuit and the current measurement circuit. In such an embodiment, the microcontroller is configured to perform the steps of determining the temperature of the sense transistor and determining the current in the load transistor.

In various embodiments, the transistor includes a load transistor coupled between an input node and an output node and configured to conduct a load current to the output node.

According to an embodiment, a measurement circuit is configured to be coupled to a conduction device that has a sense path between an input terminal and a sense terminal and a load path between the input terminal and an output terminal. The measurement circuit includes a controllable current source, a temperature measurement circuit, and a current measurement circuit. The controllable current source is configured to inject a temperature measurement current into the sense path to conduct the temperature measurement current in a first direction during a first mode. The temperature measurement circuit is configured to measure a first voltage between the input terminal and the sense terminal in the first mode and generate a temperature signal based on the first voltage that is proportional to a temperature of the conduction device. The current measurement circuit is configured to bias the sense path to conduct a sense current in a second direction during a second mode, measure a second voltage between the sense terminal and the output terminal, and determine a load current in the load path based on the second voltage. In such an embodiment, the second direction is opposite the first direction.

In various embodiments, the measurement circuit further includes the conduction device, and the conduction device includes a load transistor and a sense transistor. The load transistor has a first conduction terminal coupled to the input terminal, a second conduction terminal coupled to the output terminal, and a control terminal coupled to a switching control input. The sense transistor has a first conduction terminal coupled to the input terminal, a second conduction terminal coupled to the sense terminal, and a control terminal coupled to the switching control input.

In various embodiments, the current measurement circuit includes a switch with a first terminal and a second terminal coupled to the sense terminal, a bias current source coupled to the first terminal and configured to supply the sense current, an opamp with a first input coupled to the first terminal, a second input coupled to the output terminal, and an opamp output, and a measuring current source controlled by the opamp output and configured to generate a proportional measurement current that is proportional to the load current in the load path. In such embodiments, the switch is configured to be opened in the first mode and closed in the second mode.

In further embodiments, the measurement circuit also includes an analog to digital converter that has an analog input coupled to the temperature measurement circuit and configured to receive the temperature signal, and a digital output configured to provide a converted digital temperature signal. The measurement circuit may further include a controller coupled to the digital output and configured to calculate the temperature of the conduction device based on the converted digital temperature signal. In such embodiments, the measurement circuit may also include a transimpedance amplifier coupled to the measuring current source and configured to receive the proportional measurement current at a current input and provide a current measurement signal at a voltage output. The measurement circuit may also include a multiplexer coupled between the voltage output of the transimpedance amplifier and the analog to digital converter and coupled between the temperature measurement circuit and the analog to digital converter. The multiplexer is configured to couple either the transimpedance amplifier or the temperature measurement circuit to the analog to digital converter. In such embodiments, the controller is configured to calculate the load current in the load path based on the current measurement signal.

In still further embodiments, the measurement circuit also includes a first analog to digital converter with a first analog input coupled to the temperature measurement circuit and configured to receive the temperature signal, and a first digital output configured to provide a converted digital temperature signal; a second analog to digital converter with a second analog input coupled to the measuring current source and configured to receive the proportional measurement current, and a second digital output configured to provide a converted digital current measurement signal; and a controller coupled to the first digital output and the second digital output and configured to calculate the temperature of the conduction device based on the converted digital temperature signal and further configured to calculate the load current in the load path based on the converted digital current measurement signal.

In various embodiments, the controllable current source includes a plurality of current sources selected individually by a select signal.

According to various embodiments described herein, an advantage may include sensing a semiconductor device temperature directly in the semiconductor substrate of the semiconductor device. Sensing the semiconductor device temperature directly in the semiconductor substrate may allow more accurate temperature measurements by reducing the thermal resistance between the location of the temperature measurement and the semiconductor device. Further advantages may include reducing the number of measurement sensors by using a single sense transistor for sensing current and temperature and reducing additional measurement circuitry by using a single ADC for temperature and current measurements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a measurement circuit, the method comprising:
    injecting a measurement current into a body diode of a sense transistor in a first direction during a first mode, wherein
        the sense transistor has a first conduction channel and is integrated in a semiconductor body with a load transistor having a second conduction channel, and
        the first conduction channel and the second conduction channel are coupled to an input node;
    measuring a first voltage across the first conduction channel of the sense transistor when the measurement current is injected into the body diode; and
    determining a temperature of the sense transistor based on the first voltage.

2. The method of claim 1, further comprising biasing the sense transistor to conduct current through the first conduction channel in a second direction during a second mode, wherein the measurement current is injected in the first direction opposite the second direction.

3. The method of claim 2, wherein the sense transistor comprises a first control terminal coupled to a switching control input and the load transistor comprises a second control terminal coupled to the switching control input.

4. The method of claim 2, further comprising:
    providing a bias current to the first conduction channel during the second mode, wherein the first conduction channel is coupled to a sense node and the second conduction channel is coupled to an output node;
    measuring a second voltage between the sense node and the output node during the second mode; and
    determining a current flowing in the second conduction channel based on the second voltage.

5. The method of claim 2, wherein:
    injecting the measurement current comprises injecting a plurality of measurement currents into the body diode of the sense transistor during the first mode, wherein the plurality of measurement currents is injected in the first direction;
    measuring the first voltage comprises measuring a plurality of voltages across the sense transistor when the plurality of measurement currents are injected; and
    determining the temperature of the sense transistor comprises determining the temperature of the sense transistor based on the plurality of voltages.

6. The method of claim 5, wherein determining the temperature of the sense transistor based on the plurality of voltages comprises:
    providing the plurality of voltages through a floating voltage measurement circuit to a controller; and
    calculating the temperature based on a voltage difference of the plurality of voltages.

7. A measurement circuit comprising:
a first circuit configured to be coupled to a transistor, the first circuit configured to bias the transistor to conduct current through a first conduction channel in a first direction;
a controllable current source configured to be coupled to the transistor, the controllable current source configured to inject a first measurement current into a body diode of the transistor, wherein the first measurement current is injected in a second direction opposite the first direction; and
a temperature measurement circuit configured to be coupled to the transistor, the temperature measurement circuit configured to:
measure a first voltage across the first conduction channel of the transistor when the first measurement current is injected, and
determine a temperature of the transistor based on the first voltage.

8. The measurement circuit of claim 7, wherein:
the controllable current source is further configured to inject a second measurement current into the transistor to conduct current through the body diode in the second direction; and
the temperature measurement circuit is further configured to measure a second voltage across the transistor when the second measurement current is applied and determine the temperature of the transistor based on the first voltage and the second voltage.

9. The measurement circuit of claim 8, wherein the second measurement current is a multiple of the first measurement current.

10. The measurement circuit of claim 7, wherein:
the controllable current source is further configured to inject a plurality of measurement currents into the transistor to conduct current through the body diode in the second direction; and
the temperature measurement circuit is further configured to measure a plurality of voltages across the transistor when the plurality of measurement currents are applied and determine the temperature of the transistor based on the first voltage and the plurality of voltages.

11. The measurement circuit of claim 10, wherein the transistor comprises a sense transistor having a first conduction terminal coupled to an input node, a second conduction terminal, and a control terminal coupled to a switching control input;
the sense transistor is configured to be coupled to a load transistor having a first conduction terminal coupled to the input node, a second conduction terminal, and a control terminal coupled to the switching control input; and
the sense transistor and the load transistor are integrated in a same semiconductor substrate.

12. The measurement circuit of claim 11, further comprising a current measurement circuit configured to be coupled to the second conduction terminal of the sense transistor and configured to be coupled to the second conduction terminal of the load transistor, wherein the current measurement circuit is configured to determine the current in the load transistor based on a voltage difference between the second conduction terminal of the load transistor and the second conduction terminal of the sense transistor.

13. The measurement circuit of claim 12, further comprising the sense transistor and the load transistor.

14. The measurement circuit of claim 13, wherein the first circuit comprises a control circuit configured to:
during a temperature measurement mode, activate the controllable current source to inject the first measurement current into the second conduction terminal of the sense transistor, and deactivate the current measurement circuit; and
during a current measurement mode, activate the current measurement circuit to bias the sense transistor to conduct current through the first conduction channel, and deactivate the controllable current source.

15. The measurement circuit of claim 14, wherein the control circuit is coupled to the switching control input and configured to enable and disable the load transistor and the sense transistor such that the load transistor supplies a load current to a load and the sense transistor generates a sense current proportional to the current in the load transistor.

16. The measurement circuit of claim 15, wherein the control circuit comprises a microcontroller coupled to the temperature measurement circuit and the current measurement circuit, and wherein the microcontroller is configured to perform the steps of determining the temperature of the sense transistor and determining the current in the load transistor.

17. The measurement circuit of claim 10, wherein the transistor comprises a load transistor coupled between an input node and an output node and configured to conduct a load current to the output node.

18. A measurement circuit configured to be coupled to a conduction device comprising a sense path between an input terminal and a sense terminal, and a load path between the input terminal and an output terminal, the measurement circuit comprising:
a controllable current source configured to inject a temperature measurement current into the sense path to conduct the temperature measurement current in a first direction during a first mode;
a temperature measurement circuit configured to measure a first voltage between the input terminal and the sense terminal in the first mode and generate a temperature signal based on the first voltage that is proportional to a temperature of the conduction device; and
a current measurement circuit configured to:
bias the sense path to conduct a sense current in a second direction during a second mode, the second direction opposite the first direction,
measure a second voltage between the sense terminal and the output terminal, and
determine a load current in the load path based on the second voltage.

19. The measurement circuit of claim 18, further comprising the conduction device, wherein the conduction device comprises:
a load transistor having a first conduction terminal coupled to the input terminal, a second conduction terminal coupled to the output terminal, and a control terminal coupled to a switching control input; and
a sense transistor having a first conduction terminal coupled to the input terminal, a second conduction terminal coupled to the sense terminal, and a control terminal coupled to the switching control input.

20. The measurement circuit of claim 18, wherein the current measurement circuit comprises:
a switch having a first terminal and a second terminal coupled to the sense terminal;
a bias current source coupled to the first terminal and configured to supply the sense current, wherein the switch is configured to be opened in the first mode and closed in the second mode;

an opamp having a first input coupled to the first terminal, a second input coupled to the output terminal, and an opamp output; and a measuring current source controlled by the opamp output and configured to generate a proportional measurement current that is proportional to the load current in the load path.

21. The measurement circuit of claim 20, further comprising an analog to digital converter comprising an analog input coupled to the temperature measurement circuit and configured to receive the temperature signal, and a digital output configured to provide a converted digital temperature signal; and a controller coupled to the digital output and configured to calculate the temperature of the conduction device based on the converted digital temperature signal.

22. The measurement circuit of claim 21, further comprising:

a transimpedance amplifier coupled to the measuring current source and configured to receive the proportional measurement current at a current input and provide a current measurement signal at a voltage output; and a multiplexer coupled between the voltage output of the transimpedance amplifier and the analog to digital converter and coupled between the temperature measurement circuit and the analog to digital converter, wherein the multiplexer is configured to couple either the transimpedance amplifier or the temperature measurement circuit to the analog to digital converter, and wherein the controller is further configured to calculate the load current in the load path based on the current measurement signal.

23. The measurement circuit of claim 20, further comprising a first analog to digital converter comprising a first analog input coupled to the temperature measurement circuit and configured to receive the temperature signal, and a first digital output configured to provide a converted digital temperature signal;

a second analog to digital converter comprising a second analog input coupled to the measuring current source and configured to receive the proportional measurement current, and a second digital output configured to provide a converted digital current measurement signal; and a controller coupled to the first digital output and the second digital output and configured to calculate the temperature of the conduction device based on the converted digital temperature signal, and calculate the load current in the load path based on the converted digital current measurement signal.

24. The measurement circuit of claim 18, wherein the controllable current source comprises a plurality of current sources selected individually by a select signal.

25. A measurement circuit comprising:

a controllable current source configured to be coupled to a first sense transistor integrated in a semiconductor body with a load transistor, the controllable current source configured to inject a first measurement current into a body diode of the first sense transistor; and a temperature measurement circuit configured to be coupled to the first sense transistor, the temperature measurement circuit configured to:

measure a first voltage across a conduction path of the first sense transistor when the first measurement current is injected, and determine a temperature of the first sense transistor based on the first voltage.

26. The measurement circuit of claim 25, wherein:

the controllable current source is further configured to inject a second measurement current into the first sense transistor to conduct current through the body diode; and the temperature measurement circuit is further configured to measure a second voltage across the first sense transistor when the second measurement current is applied and determine the temperature of the first sense transistor based on the first voltage and the second voltage.

27. The measurement circuit of claim 25, further comprising a current measurement circuit configured to be coupled to a second sense transistor integrated in the semiconductor body with the load transistor, wherein the current measurement circuit is configured to determine a current in the load transistor based on a voltage difference between outputs of the load transistor and the second sense transistor.

28. The measurement circuit of claim 25, further comprising the first sense transistor and the load transistor, wherein the load transistor has a width that is more than 1000 times greater than a width of the first sense transistor.

* * * * *